US012620775B2

(12) United States Patent
Fröhlich et al.

(10) Patent No.: US 12,620,775 B2
(45) Date of Patent: May 5, 2026

(54) ELECTRONIC COMPONENT AND METHOD FOR MOUNTING AN ELECTRONIC COMPONENT

(71) Applicant: OSRAM Opto Semiconductors GmbH, Regensburg (DE)

(72) Inventors: Andreas Fröhlich, Regensburg (DE); Jens Eberhard, Lemgo (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 712 days.

(21) Appl. No.: 17/602,334

(22) PCT Filed: Mar. 19, 2020

(86) PCT No.: PCT/EP2020/057681
§ 371 (c)(1),
(2) Date: Oct. 8, 2021

(87) PCT Pub. No.: WO2020/207752
PCT Pub. Date: Oct. 15, 2020

(65) Prior Publication Data

US 2022/0166184 A1 May 26, 2022

(30) Foreign Application Priority Data

Apr. 11, 2019 (DE) ........................ 102019109586.7

(51) Int. Cl.
*H01S 5/028* (2006.01)
*H01S 5/0233* (2021.01)
*H01S 5/0235* (2021.01)

(52) U.S. Cl.
CPC ............ *H01S 5/028* (2013.01); *H01S 5/0233* (2021.01); *H01S 5/0235* (2021.01)

(58) Field of Classification Search
CPC ...... H01S 5/028; H01S 5/0283; H01S 5/0282; H01S 5/0087; H01S 5/02255; H01L 33/44; H01L 2933/0025; H01L 2933/005
See application file for complete search history.

(56) References Cited

U.S. PATENT DOCUMENTS

2004/0203312 A1 10/2004 Bortscheller et al.
2006/0187985 A1 8/2006 Behfar
(Continued)

FOREIGN PATENT DOCUMENTS

CN 1906819 A 1/2007
CN 101931161 A 12/2010
(Continued)

OTHER PUBLICATIONS

"3M™ Water-Soluble Wave Solder Tape 5414, Transparent", Technical Data, Apr. 2017, 3 pages.
(Continued)

*Primary Examiner* — Minsun O Harvey
*Assistant Examiner* — Fernanda Adriana Camacho Alanis
(74) *Attorney, Agent, or Firm* — MH2 Technology Law Group LLP

(57) ABSTRACT

The invention relates to a component comprising: a semiconductor chip; a casing material which at least partially surrounds the semiconductor chip; a protective layer which is formed with a material that is different from the casing material; wherein a side of the casing material facing away from the semiconductor chip is covered by the protective layer at least in places. The invention also relates to a method for assembling an electronic component.

14 Claims, 2 Drawing Sheets

(56) References Cited

U.S. PATENT DOCUMENTS

| | | | | |
|---|---|---|---|---|
| 2008/0049800 | A1 | 2/2008 | Hasegawa et al. | |
| 2009/0321771 | A1* | 12/2009 | Hattori | H01S 5/02255 257/98 |
| 2010/0272142 | A1 | 10/2010 | Fukuda | |
| 2010/0295079 | A1* | 11/2010 | Melman | H10H 20/851 257/E33.056 |
| 2015/0255505 | A1 | 9/2015 | Jeoung et al. | |
| 2020/0176948 | A1* | 6/2020 | Wojcik | H01S 5/02345 |
| 2021/0205487 | A1* | 7/2021 | Balme | F21V 9/35 |

FOREIGN PATENT DOCUMENTS

| | | | | |
|---|---|---|---|---|
| DE | 102008005936 | A1 * | 7/2009 | H10F 77/331 |
| EP | 3152619 | A1 | 4/2017 | |
| JP | H53371 | A | 1/1993 | |
| JP | H53377 | A | 1/1993 | |
| JP | 2004128297 | A | 4/2004 | |
| JP | 2007281277 | A | 10/2007 | |
| JP | 2012-064886 | A | 3/2012 | |
| JP | 2015050359 | A | 3/2015 | |
| KR | 20070084959 | A | 8/2007 | |
| KR | 20140127034 | A * | 11/2014 | H01S 5/18383 |
| WO | 02101894 | A1 | 12/2002 | |

OTHER PUBLICATIONS

International Search Report (with English Translation) and Written Opinion in corresponding International Application No. PCT/EP2020/057681 mailed on May 6, 2020, 13 pages.

Japanese Notice of Reasons for Rejection in Japanese Application No. 2021-559595 mailed on Sep. 27, 2022, 11 pages.

Japanese Notice of Reasons for Rejection in Japanese Application No. 2021-559595 mailed on Mar. 1, 2023, with English language translation, 9 pages.

Chinese Notice of Allowance in Chinese Application No. 2020800279761 mailed on Nov. 28, 2024, with English language translation, 10 pages.

* cited by examiner

ELECTRONIC COMPONENT AND METHOD FOR MOUNTING AN ELECTRONIC COMPONENT

CROSS-REFERENCE TO RELATED APPLICATIONS

This patent application is a national stage entry from International Application No. PCT/EP2020/057681, filed on Mar. 19, 2020, published as International Publication No. WO 2020/207752 A1 on Oct. 15, 2020, and claims priority under 35 U.S.C. § 119 from German patent application 10 2019 109 586.7, filed Apr. 11, 2019, the entire contents of all of which are incorporated by reference herein.

FIELD

An electronic component is specified. In addition, a method for mounting an electronic component is specified.

BACKGROUND

One task to be solved is to specify an improved electronic component. Another problem to be solved is to provide a method for mounting an electronic component.

SUMMARY

An electronic component is specified.

For example, the electronic component may be an integrated circuit, a transistor, a memory element, a resistor, or an optoelectronic component. For example, the optoelectronic component is a semiconductor laser component, a light emitting diode, an optical amplifier, or a photodiode.

Semiconductor laser components can, for example, be realized in so-called TO designs (TO: "transistor outline"). In this case, a compact TO metal package is common. The compact TO metal package is essentially made of steel or copper.

According to at least one embodiment, the electronic component comprises a semiconductor chip. The semiconductor chip is, for example, an electronic semiconductor chip. For example, the semiconductor chip is an optoelectronic semiconductor chip. The optoelectronic semiconductor chip, such as a light-emitting diode chip, a photodiode chip, and/or a laser diode chip, has an epitaxially grown semiconductor layer sequence with an active region adapted to detect or generate electromagnetic radiation. In operation, the optoelectronic semiconductor chip can emit and/or receive electromagnetic radiation from a wavelength range of UV radiation, blue light and/or in the infrared range, for example.

According to at least one embodiment, the electronic component comprises a coating material that at least partially surrounds the semiconductor chip. That is, the semiconductor chip is at least partially surrounded by the coating material and is thus protected from external mechanical or chemical influences. Alternatively or additionally, the coating material may serve as a matrix material for a phosphor material for forming a conversion layer. The phosphor material is then provided to absorb the emitted electromagnetic radiation of the semiconductor chip and convert it into another electromagnetic radiation. The emitted electromagnetic radiation of the semiconductor chip is then different from the emitted further electromagnetic radiation of the phosphor material.

The coating material is preferably translucent or clear transparent to electromagnetic radiation, for example visible light. Preferably, the coating material is formed from a polymer. For example, the coating material may comprise an epoxy resin or a silicone or consist of an epoxy resin or a silicone.

According to at least one embodiment, the electronic component comprises a protective layer formed with a material that is different from the coating material. Preferably, the protective layer comprises as a material a polymer that is different from the polymer of the coating material. The material of the protective layer comprises different chemical and physical properties compared to the coating material. For example, the materials exhibit different solubility in different solvents and/or the materials exhibit different temperature stability. The protective layer is preferably intended to protect the coating material from environmental influences, such as contaminants and particles.

Preferably, the protective layer can be removed from the coating material without leaving any residue. This can mean, for example, that when the protective layer is removed, it can be removed completely without leaving residues on the surface to which the protective layer was applied before removal.

For example, the protective layer comprises a thickness between at least 0.01 millimeter and at most 0.1 millimeter. Preferably, the protective layer comprises a thickness of between at least 0.015 millimeter and at most 0.08 millimeter. A protective layer that is too thin would result in insufficient protection of the coating material against environmental influences such as contamination, and a protective layer that is too thick would result in poorer removability of the protective layer.

According to at least one further embodiment, the electronic component comprises a side of the coating material facing away from the semiconductor chip which is covered at least in places by the protective layer. The protective layer may completely or locally cover the side of the coating material facing away from the semiconductor chip. The protective layer may be applied as a layer and/or as a foil. Furthermore, the protective layer may preferably be applied directly to the coating material. Alternatively, a water-soluble polymeric material may be disposed between the protective layer and the coating material as an adhesive layer and may comprise, for example, a polyvinyl alcohol. The polymer material of the adhesive layer is in particular different from the protective layer.

According to at least one embodiment of the electronic component, the electronic component comprises a semiconductor chip, a coating material that at least partially surrounds the semiconductor chip, and a protective layer formed with a material coating from the coating material, wherein a side of the coating material facing away from the semiconductor chip is covered at least in places by the protective layer.

One idea of the present electronic component is to apply a protective layer on a coating material in order to thus protect the surface of the coating material from environmental influences, preferably from contaminants and particles. Preferably, the protective layer is to be applied during mounting of the electronic component. Particularly preferably, a material is selected for the protective layer that survives mounting procedures undamaged and can then be removed particularly easily and particularly without leaving residues. The fact that the protective layer is not damaged, in particular not detached, during the mounting processes means that the coating material remains protected during the mounting process.

According to at least one embodiment, the protective layer is soluble in a polar solvent. The polar solvent preferably comprises a functional group from which hydrogen atoms in the molecule can be split off as a proton. For example, the protective layer is soluble in a polar solvent, such as an alcohol, water, a carboxylic acid and/or a mineral acid.

According to at least one embodiment, the protective layer is a water-soluble polymer or consists of a water-soluble polymer. This means that the protective layer is preferably almost completely soluble in water.

Water-soluble polymers preferably have a sufficient number of hydrophilic groups and exhibit only minor crosslinking. The hydrophilic groups can be non-ionic, anionic, cationic or zwitterionic groups. The following list shows hydrophilic, i.e. water-soluble, groups that can serve as building blocks for the water-soluble polymer:

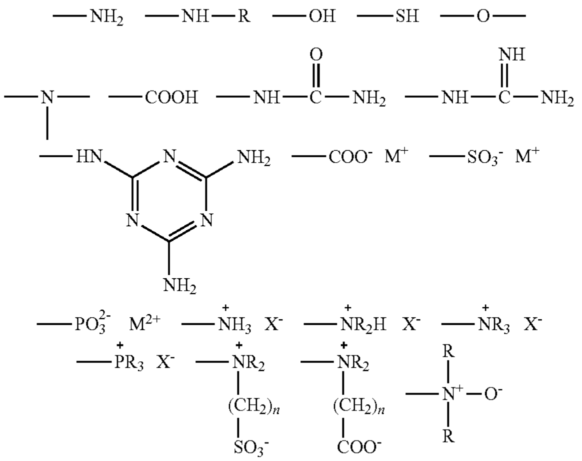

The water-soluble polymer is obtained in particular from the above-mentioned building blocks. Here, for example, the water-soluble polymer may have the same building blocks or the water-soluble polymer may have different building blocks. If the water-soluble polymer has different building blocks, then this can also be referred to as a water-soluble copolymer. Water-soluble copolymers are polymers composed of two or more different types of building blocks. The chemical and physical properties of the water-soluble copolymer can be adjusted particularly well by the composition of different monomer units.

According to at least one preferred embodiment, the water-soluble polymer comprises a polyvinyl alcohol or consists of a polyvinyl alcohol. Due to the hydrophilic OH group, the polyvinyl alcohol is particularly readily soluble in water and can be removed from the coating material in the process particularly well without leaving any residue. In addition, the polyvinyl alcohol forms a thermoplastic polymer. Thermoplastic polymers are characterized by a low degree of branching of carbon chains, and the carbon chains are linked together by weak physical bonds. Thus, the polyvinyl alcohol is particularly well suited as a protective material due to its high flexibility as well as good water solubility.

According to at least one embodiment, the coating material comprises a silicone or consists of a silicone. The silicone is preferably present in an optical quality and exhibits particularly good aging stability compared to the epoxy resin. The silicone as the coating material is a transparent, elastic thermosetting material. Further advantages are that the silicone yellows little in operation, is heat-resistant and UV-stable. For example, the coating material comprises a transmittance to electromagnetic radiation of at least 90%, particularly at least 95%. The silicone exhibits some adhesiveness, due to molecular properties such as chain mobility/length as well as side groups. Thus, contaminants and particles adhere to the coating material.

According to at least one embodiment, the protective layer is in direct contact with the coating material. This means that preferably no additional layer is arranged between the protective layer and the coating material. For example, the protective layer may bind directly to the coating material due to the sticky surface of the coating material. Due to the direct contact with the coating material, the protective layer serves to protect against contamination and particles.

According to at least one embodiment, the coating material forms a chemical bond with the protective layer. That is, the protective layer chemically bonds to the coating material. For example, the OH groups of the polyvinyl alcohol bind to the silicon atom of the silicone. For example, the chemical bond may be a coordinative bond or a covalent bond. Preferably, the chemical bond between the protective layer and the coating material is not a strong bond, because if the chemical bond is too strong, it is more difficult to separate the protective layer from the coating material when it is peeled off in the process. However, if the chemical bond is too weak, this will result in poor protection of the coating material and unintentional detachment of the protective material, for example during mounting of the component.

A combination of the coating material comprising the silicone and the protective layer being soluble in a polar solvent advantageously results in the chemical bonding leading to good adhesion of the protective layer to the coating material and residue-free detachment of the protective layer from the coating material in a polar solvent.

According to at least one embodiment, an intermediate layer and/or a cover layer is arranged on the side of the protective layer facing away from the semiconductor chip. For example, the intermediate layer may be in direct contact with the protective layer. Additionally, the cover layer may be in direct contact with the intermediate layer. The advantage of applying additional layers to the protective layer is that, in the method, when the layers are removed, they can be easily removed from a solvent bath because they float on the solvent surface due to the intermediate layer and cover layer. Preferably, the solvent bath is filled with a polar solvent, such as water. Furthermore, the intermediate layer and/or the cover layer serve as additional protection of the protective layer and thus of the coating material.

For example, the cover layer can be removed before the protective layer is applied to the electronic component or after the protective layer is applied to the electronic component.

According to at least one embodiment, the intermediate layer comprises a water-soluble adhesive material. The thickness of the intermediate layer is preferably between at least 0.01 millimeter and at most 0.1 millimeter. Preferably, the thickness of the intermediate layer is between at least 0.015 millimeter and at most 0.08 millimeter. Further, the intermediate layer may comprise two or more sublayers. For example, the thickness of the intermediate layer is thinner than the thickness of the protective layer.

For example, the protective layer is in direct contact with the coating material, on the side facing away from the semiconductor chip. The intermediate layer is in direct contact with the protective layer, on the side facing away from the coating material. The cover layer is in direct contact with the intermediate layer, on the side facing away from the protective layer. Preferably, the protective layer comprises a thickness between at least 0.030 millimeter and at most 0.035 millimeter, for example of 0.033 millimeter. Preferably, the intermediate layer comprises a thickness between at least 0.017 millimeter and at most 0.023 millimeter, for example of 0.020 millimeter.

According to at least one embodiment, the electronic component is a radiation-emitting component, in particular an edge-emitting semiconductor laser component.

The edge-emitting semiconductor laser component comprises a semiconductor chip that is set up to emit laser radiation. That is, in operation, the semiconductor chip emits electromagnetic radiation, for example, in the wavelength range between IR and UV radiation.

According to at least one embodiment, the semiconductor chip emits electromagnetic radiation of a wavelength range in the infrared range during operation. The wavelength range of the infrared range is between at least 1 millimeter and at most 780 nanometers. Preferably, the wavelength range is between at least 1000 nanometers and at most 780 nanometers, and particularly preferably, the range is between at least 950 nanometers and at most 850 nanometers.

The infrared semiconductor laser components are used, among other things, in LIDAR ("Light Detection and Ranging") sensor technology.

Alternatively, the semiconductor chip may emit electromagnetic radiation of a wavelength range in the green spectral region during operation.

The semiconductor chip is in particular an edge-emitting semiconductor laser chip in which the laser radiation emerges at an end face, i.e. a facet, of the semiconductor chip. That is, the radiation passing surface of the semiconductor chip, through which the generated laser radiation emerges from the semiconductor chip during operation, is located at the first end face.

Further, the edge emitting semiconductor laser component comprises a coating material that at least partially surrounds the semiconductor chip. The coating material preferably completely surrounds the radiation passing surface of the semiconductor chip, for example. The area from which the electromagnetic radiation of the edge-emitting semiconductor laser component exits is referred to herein as the radiation exit surface. The radiation exit surface of the electronic component is parallel to the radiation passing surface of the semiconductor chip.

According to at least one embodiment, the radiation exit surface is located on the side of the coating material facing away from the semiconductor chip. The electromagnetic radiation of the semiconductor chip passes through the coating material and through the radiation exit surface. The radiation exit surface is followed by the protective layer.

That is, the protective layer is arranged laterally spaced from the semiconductor chip on the coating material. The protective layer runs in particular transversely or perpendicularly to an bottom side of the semiconductor chip. According to at least one embodiment, the bottom side of the semiconductor chip is perpendicular to the radiation passing surface and to the radiation exit surface.

In addition, the edge-emitting semiconductor laser component includes the protective layer surrounding the coating material at least in places. In particular, the protective layer covers the coating material at the radiation exit surface. Particularly preferably, the protective layer completely covers the coating material at the radiation exit surface.

According to at least one embodiment, the electronic component comprises the radiation exit surface partially or completely covered by the protective layer. That is, another layer may be arranged between the protective layer and the radiation exit surface. Preferably, the protective layer is arranged on the radiation exit surface.

In an edge-emitting electronic semiconductor laser component, the radiation exit surface is located at the end face of the electronic semiconductor laser component. Furthermore, the radiation exit surface is preferably completely covered by the protective layer. The protective layer protects the radiation exit surface from possible scratches and/or from contaminants, such as particles, on the surface of the coating material. Advantageously, the protective layer improves the light extraction from the radiation exit surface of the electronic component, since in the method the removal of the protective layer leads to a preferred clean radiation exit surface.

A method for mounting an electronic component is further specified. Preferably, the method described herein can be used to mount the electronic component described herein. That is, all features disclosed for the electronic component are also disclosed for the method for mounting an electronic component, and vice versa.

According to at least one embodiment of the method for mounting an electronic component, the electronic component described herein is provided. The electronic component is placed on a carrier. Subsequently, the protective layer is removed.

According to at least one embodiment, providing the electronic component comprises the following steps:

providing the semiconductor chip, surrounding the semiconductor chip at least in places with the coating material, and applying the protective layer at least in places to the coating material.

In a first step, the semiconductor chip is provided. Then, the semiconductor chip is surrounded by the coating material at least in places. For example, the semiconductor chip is surrounded by the coating material on one to five sides of the semiconductor chip. The sixth side of the semiconductor chip, which corresponds in particular to the bottom side, preferably remains free of the coating material. The bottom side is preferably arranged on a support surface. Alternatively, the coating material may encapsulate a plurality of semiconductor chips simultaneously. That is, the plurality of semiconductor chips is encapsulate by a common coating material.

The protective layer is applied, for example, by means of a spin coating process. The spin coating process is a method of applying thin and uniform layers or films to the coating material. In this method, the semiconductor chip, which is surrounded at least in places by the coating material, is fixed to a turntable. The desired amount of protective layer is applied as a solution by means of a metering device above the center of the semiconductor chip, which is surrounded at least in places by the coating material. Acceleration, final speed and time are set on the spin coater and the protective layer is evenly distributed to the desired locations on the surface of the coating material and dried. Final drying, if necessary, can be carried out, for example, thermally assisted in an oven. In this case, a common protective layer is preferably applied to the common coating material wrapping a plurality of semiconductor chips.

Another method for applying the protective layer is the localized application of a small amount of the protective coating solution by suitable dosing methods, such as needle dosing, at the desired location, for example at the radiation exit surface.

According to at least one embodiment, the carrier comprises a printed circuit board. Preferably, the printed circuit board is a printed circuit board. Particularly preferably, the printed circuit board is a sensor board.

According to at least one embodiment, the protective layer is removed in the solvent bath, which is preferably filled with a polar solvent, for example water. This means that after the electronic component has been mounted on the carrier, the protective layer is removed in the solvent bath. The water dissolves the chemical bonds between the protective layer and the coating material. This method of removing the protective layer is gentle compared to conventional methods, such as water pressure and using cleaning agents, and does not damage the coating material. The method can be supported thermally, i.e. by temperatures between 4° C. and 100° C., particularly preferably between 25° C. and 60° C., to accelerate the dissolution of the protective layer. Preferably, the protective layer, and optionally the intermediate layer and the cover layer, remain in the solvent bath. These can be removed from the solvent bath using a suitable method.

One idea of the present electronic component is to protect the radiation exit surface of the coating material of the electronic component from environmental influences, such as contaminants and particles.

In the case of conventional electronic components with an epoxy resin coating material or an electronic component with a TO metal housing, contamination and particles can be removed using water pressure and cleaning agents. When using an electronic component with a more age-stable, elastic silicone coating material, this cannot be done with a conventional cleaning process due to damage to the elastic coating material.

This water-soluble protective layer protects the surface of the coating material from contamination, for example particles. Furthermore, the application of a protective layer to the coating material is of great benefit to the end user. First, the electronic component is mounted on a carrier and the subsequent removal of the protective layer is easily done, for example, in the solvent bath. Thus, the manageability for the end user is significantly improved, since the electronic component is protected from harmful environmental influences and contamination until the end. The light extraction is thus improved as there is no scattered light and no reduction in absolute output power due to absorption of the laser radiation by the contaminants/particles. On the other hand, the probability of contaminated electronic components and, possibly, failures after mounting is significantly reduced.

Further advantageous embodiments and further embodiments of the electronic component and of the method for mounting an electronic component result from the exemplary embodiments described below in connection with the figures.

DETAILED DESCRIPTION

Elements that are identical, similar or have the same effect are given the same reference signs in the figures. The figures and the proportions of the elements shown in the figures are not to be regarded as true to scale. Rather, individual elements, in particular layer thicknesses, may be shown exaggeratedly large for better representability and/or understanding.

Figure 1:
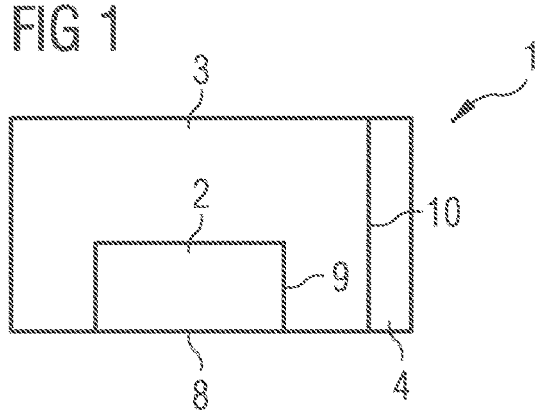
FIG. 1, FIG. 2, FIG. 3 and FIG. 4 are each a schematic sectional view of an electronic component according to an exemplary embodiment.

The electronic component 1 according to the exemplary embodiment of FIG. 1 comprises a semiconductor chip 2, a coating material 3 and a protective layer 4. The semiconductor chip 2 emits electromagnetic radiation of a wavelength range in the infrared range during operation. The wavelength range of the infrared range is between 1000 nanometers and 780 nanometers inclusive, preferably the range is between 950 nanometers and 850 nanometers inclusive. The coating material 3 here at least partially surrounds the semiconductor chip 2.

For example, five sides of the semiconductor chip 2 are surrounded by the coating material 3. The sixth side of the semiconductor chip 2, which corresponds to the bottom side 8, remains free of the coating material 3. The side of the coating material 3 facing away from the semiconductor chip 2 is covered at least in places by the protective layer 4. The coating material 3 comprises a silicone or consists of a silicone. Furthermore, the protective layer 4 is soluble in a polar solvent. The protective layer 4 comprises a water-soluble polymer or consists of a water-soluble polymer. The water-soluble polymer is, for example, a polyvinyl alcohol. The polyvinyl alcohol has an OH group and binds to the coating material 3. The protective layer 4 thus has a material that is different from the coating material 3. The material for the protective layer 4 is selected in such a way that the protective layer 4 survives mounting processes undamaged and can subsequently be removed particularly easily and particularly residue-free.

In FIG. 1, the component is an edge-emitting semiconductor laser component. The semiconductor chip 2 emits electromagnetic radiation and emits it at the end face, that is, at the radiation passing surface 9 of the semiconductor chip 2. The side face of the electronic component 1 corresponds to the radiation exit surface 10. The radiation exit surface 10 of the electronic component 1 is parallel to the radiation passing surface 9 of the semiconductor chip 2. The protective layer 4 is applied to the radiation exit surface 10 to protect the surface of the coating material 3. This protects the electronic component 1 from contamination and particles. The protective layer 4 is here in direct contact with the coating material 3, but can also be applied with the aid of an additional adhesive layer. The adhesive layer has, for example, a polyvinyl alcohol with a different chain length than the protective layer 4. The protective layer 4 can be applied as a layer and/or as a foil.

Figure 2:
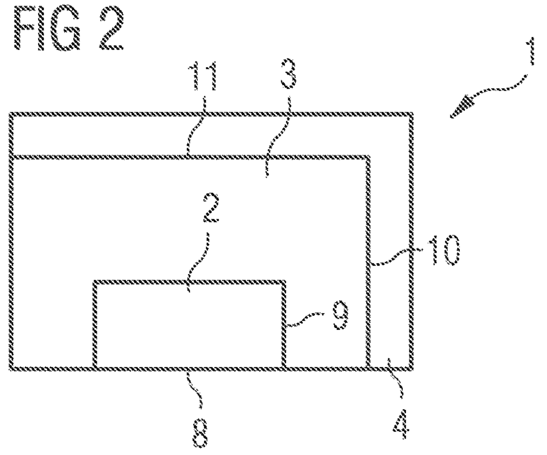

The exemplary embodiment shown in FIG. 2 shows an electronic component 1 that differs from the electronic component 1 of FIG. 1 in that a protective layer 4 is additionally arranged on a top surface 11 of the electronic component 1 that faces the semiconductor chip 2. Here, the semiconductor chip 2 can emit electromagnetic radiation in all directions, for example. Further, for example, the protective layer 4 arranged on the top surface 11 may serve for better adhesion of the protective layer 4 arranged on the radiation exit surface 10.

Figure 3:
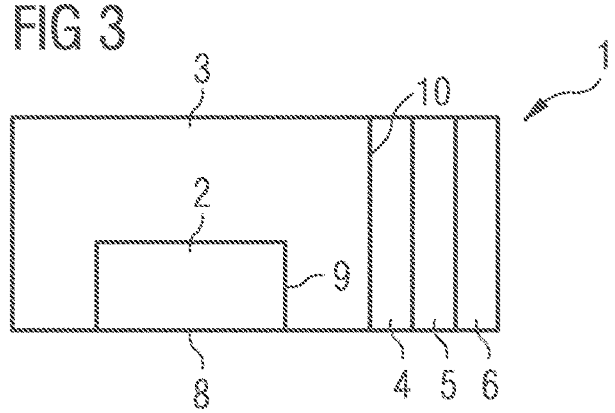

According to the exemplary embodiment of FIG. 3, an additional intermediate layer 5 and a cover layer 6 are arranged next to the protective layer 4 on the side of the protective layer 4 facing away from the semiconductor chip 2. The intermediate layer 5 is preferably in direct contact with the protective layer 4 and the cover layer 6 is in direct contact with the intermediate layer 5. The protective layer 4 comprises a thickness between at least 0.01 millimeter and at most 0.1 millimeter. In particular, the protective layer 4 has a thickness between at least 0.030 millimeter and at most 0.035 millimeter. For example, the protective layer 4 has a thickness of 0.033 millimeter. Preferably, the intermediate layer 5 has a thickness between at least 0.01 millimeter and 0.1 millimeter. In particular, the intermediate layer 5 has a thickness between at least 0.017 millimeter and at most 0.023 millimeter. For example, the intermediate layer 5 has a thickness of 0.020 millimeter.

The advantage here is that when the layer sequence is detached in a solvent bath, for example a water bath, the layer sequence can preferably be removed by floating on the water surface after detachment. The intermediate layer 5 has a water-soluble adhesive material, preferably a water-soluble polymer material, and may also have, for example, a polyvinyl alcohol of a different chain length, different from the protective layer 4.

Figure 4:
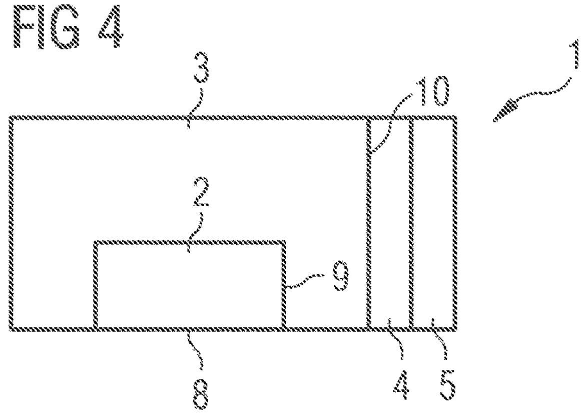

The exemplary embodiment shown in FIG. 4 shows an electronic component 1 which differs from the electronic component 1 of FIG. 3 in that no cover layer 6 is arranged on the intermediate layer 5. The cover layer 6 has been removed before the protective layer 4 and the intermediate layer 5 are applied to the electronic component 1.

Figure 5:
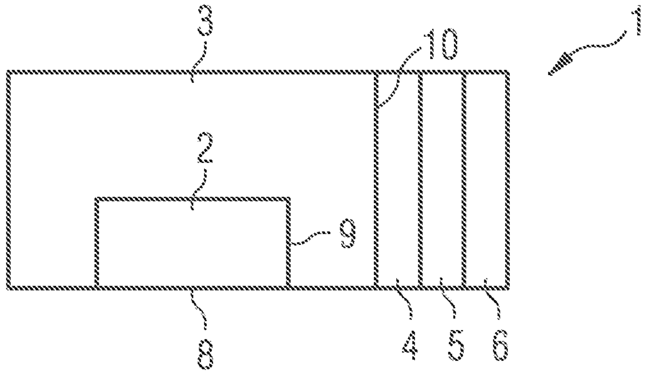
FIG. 5, FIG. 6 and FIG. 7 are schematic sectional views of various method stages of a method for mounting an electronic component according to an exemplary embodiment.
Figure 6:
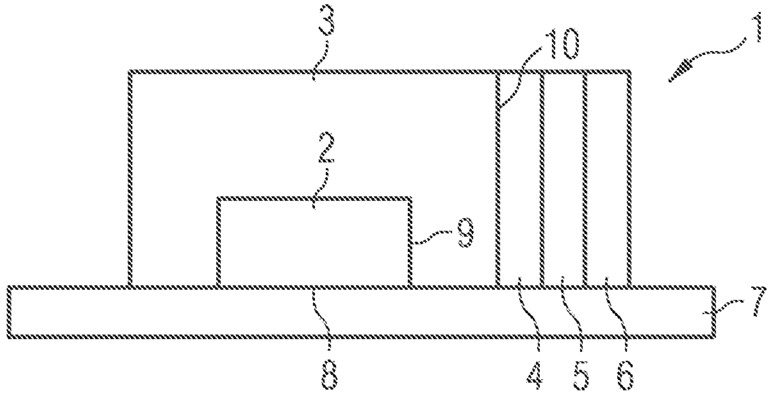
Figure 7:
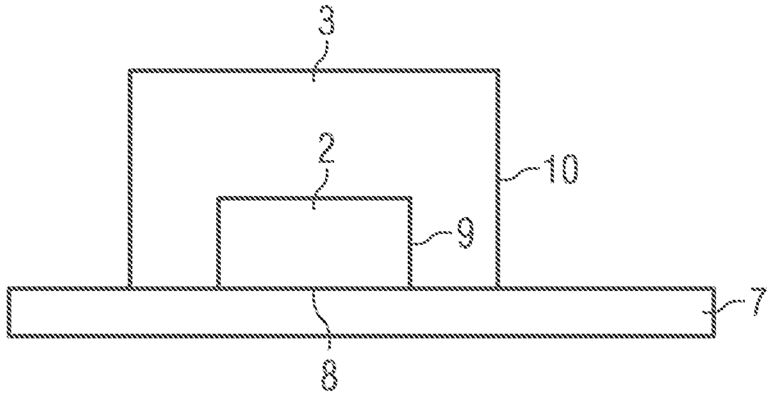

In the method for mounting an electronic component 1 according to the exemplary embodiment of FIGS. 5 to 7, the electronic component 1 is provided in a first step, FIG. 5.

The electronic component 1 is provided by first placing the semiconductor chip 2, with its bottom side 8, on a support surface and then surrounding the semiconductor chip 2 at least in places with the coating material 3. By applying the protective layer 4 at least in places as a solution, for example by means of a spin coating process, to the coating material 3, the electronic component 1 is obtained. The protective layer 4 is distributed as a solution onto the desired locations of the surface of the coating material 3 and dried. Final drying can be done, for example, thermally assisted in an oven. The electronic component 1 is placed on a carrier 7 during mounting, FIG. 6. The carrier 7 is, for example, a printed circuit board. For example, the carrier 7 is a printed circuit board.

In a final step, the protective layer 4 and/or intermediate layer 5 and/or cover layer 6 is removed from the coating material 3, FIG. 7.

The protective layer 4 is removed in the solvent bath. Preferably, the protective layer 4 is removed in the water bath. Thus, with advantage, the protective layer 4 can be easily and simply separated from the coating material 3 and the surface of the coating material 3 is free of any contamination and particles. This leads to a preferred light extraction from the radiation exit surface 10 of the electronic component 1. Preferably, the protective layer 4 is detached from the coating material 3 particularly without leaving any residue.

The features and exemplary embodiments described in connection with the figures can be combined with each other according to further exemplary embodiments, even if not all combinations are explicitly described. Furthermore, the exemplary embodiments described in connection with the figures may alternatively or additionally have further features according to the description in the general part.

The invention is not limited to these by the description based on the exemplary embodiments. Rather, the invention encompasses any new feature as well as any combination of features, which in particular includes any combination of features in the patent claims, even if this feature or combination itself is not explicitly stated in the patent claims or exemplary embodiments.

The invention claimed is:

1. An electronic component which is an edge-emitting semiconductor laser component comprising:
- an edge-emitting semiconductor chip,
- a coating material which at least partially surrounds the semiconductor chip,
- a radiation exit surface being parallel to a radiation passing surface of the semiconductor chip,
- a protective layer which is formed with a material which is different from the coating material, wherein
- a side of the coating material facing away from the semiconductor chip is covered at least in places by the protective layer,
- the protective layer partially or completely covers the radiation exit surface,
- the protective layer runs transversely or perpendicularly to a bottom side of the semiconductor chip, and
- in which the protective layer is soluble in a polar solvent and the protective layer comprises a water-soluble polymer.

2. The electronic component according to claim 1, in which the water-soluble polymer comprises a polyvinyl alcohol or consists of a polyvinyl alcohol.

3. The electronic component according to claim 1,
- in which the coating material comprises a silicone or consists of a silicone.

4. The electronic component according to claim 1,
- in which the protective layer is in direct contact with the coating material.

5. The electronic component according to claim 1,
- in which the coating material forms a chemical bond with the protective layer.

6. The electronic component according to claim 1,
- in which an intermediate layer and/or a cover layer is arranged on the side of the protective layer facing away from the semiconductor chip.

7. The electronic component according to claim 6,
- in which the intermediate layer comprises a water-soluble adhesive material.

8. The electronic component according to claim 1,
- in which the semiconductor chip emits electromagnetic radiation of a wavelength range in the infrared range during operation.

9. A method for mounting an electronic component comprising:
- A) providing the electronic component according to claim 1,
- B) placing the electronic component on a carrier, and
- C) removing the protective layer.

10. The method according to claim 9,
- wherein the providing of the electronic component comprises the following steps:
- providing the semiconductor chip,
- surrounding the semiconductor chip at least in places with the coating material, and
- applying the protective layer at least in places on the coating material.

11. The method according to claim 9, in which the carrier comprises a printed circuit board.

12. The method according to claim 9, wherein the removal of the protective layer being carried out in a solvent bath.

13. An electronic component which is an edge-emitting semiconductor laser component comprising:

a semiconductor chip;

a coating material which at least partially surrounds the semiconductor chip, wherein five sides of the semiconductor chip are surrounded by the coating material;

a radiation exit surface;

a protective layer which is formed with a material which is different from the coating material; wherein:

a side of the coating material facing away from the semiconductor chip is covered at least in places by the protective layer;

the protective layer partially or completely covers the radiation exit surface, and the protective layer is additionally arranged on a top surface of the electronic component that faces the semiconductor chip.

14. An electronic component which is an edge-emitting semiconductor laser component comprising:

an edge-emitting semiconductor chip, a coating material which at least partially surrounds the semiconductor chip, a radiation exit surface being parallel to a radiation passing surface of the semiconductor chip, a protective layer which is formed with a material which is different from the coating material, wherein a side of the coating material facing away from the semiconductor chip is covered at least in places by the protective layer, the protective layer partially or completely covers the radiation exit surface, and the protective layer partially or completely covers the radiation exit surface, and the protective layer comprises a thickness between at least 0.030 millimeter and at most 0.035 millimeter.

* * * * *